United States Patent [19]

Inamura et al.

[11] Patent Number: 4,806,857

[45] Date of Patent: Feb. 21, 1989

[54] APPARATUS FOR TESTING SEMICONDUCTOR DEVICES

[75] Inventors: Kazuhiko Inamura; Yoji Tashita, both of Tokyo, Japan

[73] Assignee: Oki Electric Industry Co., Ltd., Tokyo, Japan

[21] Appl. No.: 33,495

[22] Filed: Apr. 2, 1987

[30] Foreign Application Priority Data

Apr. 11, 1986 [JP] Japan .................................. 61-82394
Apr. 11, 1986 [JP] Japan .............................. 61-53610[U]

[51] Int. Cl.⁴ ........................ G01R 31/26; G01R 1/04
[52] U.S. Cl. .............................. 324/158 R; 324/158 F
[58] Field of Search ....................... 324/158 R, 158 F; 361/225

[56] References Cited

U.S. PATENT DOCUMENTS 4,636,724 1/1987 Fukuda et al. .................. 324/158 R
4,677,375 6/1987 Nakaie et al. .................... 324/158 F

FOREIGN PATENT DOCUMENTS 60-73375 4/1985 Japan .

Primary Examiner—Jerry Smith
Assistant Examiner—Stephen M. Baker
Attorney, Agent, or Firm—Wenderoth, Lind & Ponack

[57] ABSTRACT

An apparatus for testing a semiconductor device including a dielectric package and a lead with respect to the breakdown voltage thereof against electrostatic charges stored on the dielectric package. The apparatus includes a charger having a metal plate connected to an output terminal of a DC power source for charging the dielectric package by bringing the metal plate into contact with the surface of the package when voltage is supplied from the DC power source thereto; a first discharger has a metal bar connected to a ground potential is provided for discharging charges on the package by selectively bringing the metal bar into contact with the leads subsequent to the charging of the package, and a second discharger having a terminal connected to the ground potential is provided for discharging the charges remaining in a circuit of the semiconductor device by bringing the terminal into contact with the lead after stopping the supply of the voltage from the DC power source subsequent to the discharging by the first discharger.

2 Claims, 5 Drawing Sheets

APPARATUS FOR TESTING SEMICONDUCTOR DEVICES

BACKGROUND OF THE INVENTION

1. Field of the Invention

The present invention relates to an apparatus for testing the electrostatic breakdown of a semiconductor device and for thereby securely and stably monitoring the electrostatic breakdown using a charged device model which has been damaged due to electrostatic charges stored on a dielectric package of the semiconductor device.

2. Description of the Prior Art

An MOS IC, as being highly integrated and made minute, is likely to experience an electrostatic breakdown since it has been made fine at present, e.g., less than 2 $\mu$m in its designed pattern as well as less than 35 $\mu$m in its gate oxide film. In addition, such an electrostatic breakdown may also originate from diversified packagings thereof.

A flat package, for example, tends to have a higher electrostatic capacity due to the mold resin thereof being made thinner, and hence to have more electric charges stored thereon. Moreover, a chip-on board IC allows the chip to be charged with electrostatic charges directly thereon. The electrostatic charges may damage a gate oxide film and a junction thereof.

The mechanism of this electrostatic breakdown phenomenon can be caused by allowing the package surface to be charged with static electricity, which is then discharged through a lead.

The present applicant has proposed "the charged package method", as a method of testing the electrostatic breakdown of a semiconductor device by charging a package thereof with electricity, which has been described in detail in Japanese Laid-Open Patent Publication No. 60-73375. By the use of this charged package breakdown testing method, it has been possible to determine the equivalent parameters of an electrostatic breakdown phenomenon caused due to charges stored on a package, and the design of the circuit, the shape of the package, and the like.

It is necessary to effect the steps of charging an IC to be tested with electricity and of discharging it from leads of the IC in repetition for each lead and for each voltage due to the charges on the package. For example, in testing an IC with 64 pins, 64 × several times or several tens of times repetitions are needed.

Furthermore, it takes several seconds to lower a voltage of a power source to zero, owing to the internal capacitance of the power source. Thus, after the test with one lead, it is impossible to start the test with another lead instantly.

SUMMARY OF THE INVENTION

An object of the present invention is to provide an apparatus for testing the electrostatic breakdown voltage of an IC. Another object of the present invention is to provide an apparatus for testing the electrostatic breakdown voltage of an IC using the charged package method with ease and rapidity.

The present invention provides an apparatus for testing a semiconductor device including a dielectric package and a lead with respect to the breakdown voltage thereof against electrostatic charges stored on the dielectric package. The apparatus comprises a charging means having a metal plate connected to an output terminal of a DC power source for charging the dielectric package by bringing the metal plate into contact with the surface of the package when a voltage is supplied from the DC power source thereto, a first discharge means having a metal bar connected to a ground potential via a load impedance for discharging charges stored on the package by selectively bringing the metal bar into contact with the lead in the successive charging of the package, and a second discharge means having a terminal connected to the ground potential via a resistor for discharging remaining charges in a circuit of the semiconductor device by bringing the terminal into contact with the lead after stopping the supply of the voltage subsequent to the discharging by the first discharge means.

The above and other objects, features and advantages of the present invention will become more apparent from the following description when taken in conjunction with the accompanying drawings in which preferred embodiments of the present invention is shown by way of illustrative example.

DESCRIPTION OF THE PREFERRED EMBODIMENT

An embodiment of electrostatic breakdown testing apparatus for a semiconductor device according to the present invention will be described with reference to the accompanying drawings.

Figure 1:
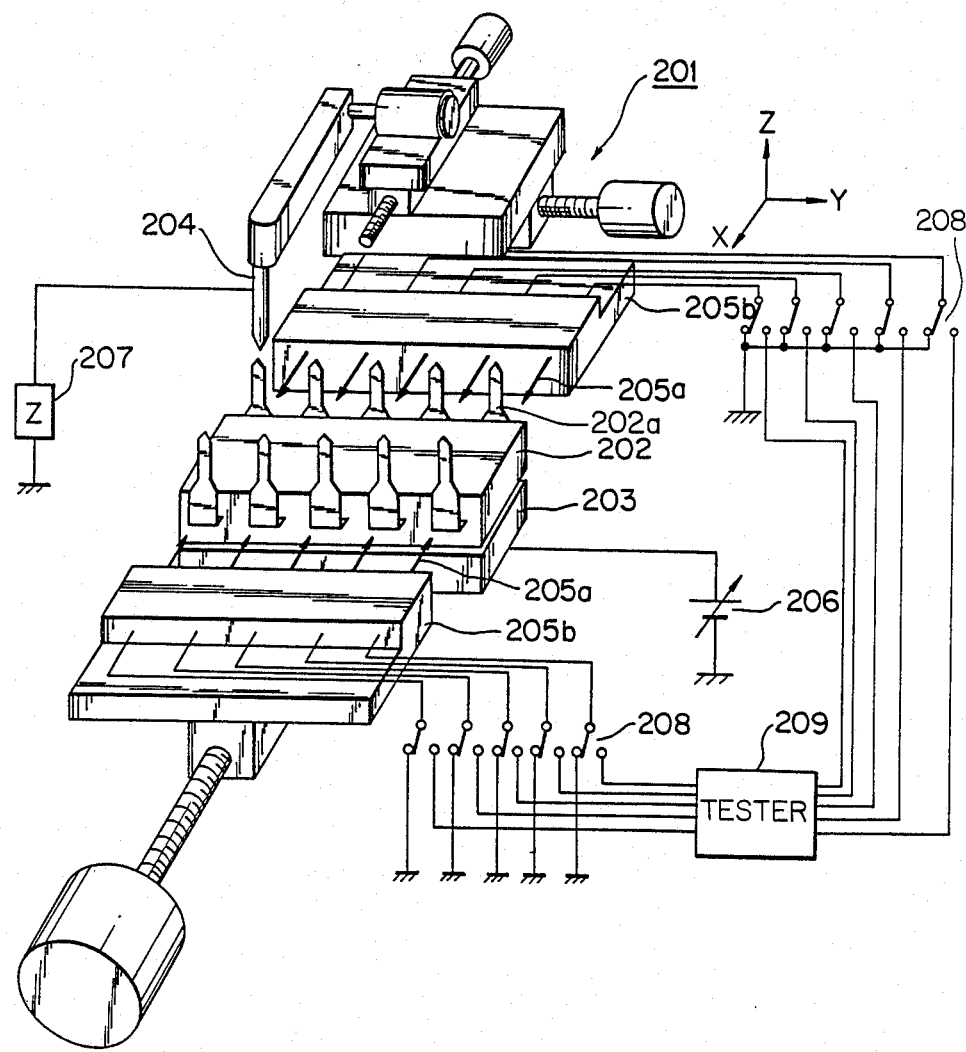
FIG. 1 is a schematical view illustrating an embodiment of an electrostatic breakdown voltage test apparatus according to the present invention.

As shown in FIG. 1, which schematically illustrates an embodiment of the electrostatic breakdown voltage testing apparatus, the electrostatic breakdown voltage testing apparatus 201 consists of an metal plate 203 for applying a high DC voltage to a package of an IC 202 to be tested and for thereby charging it with electricity, a metal bar 204 for producing an electrical discharge by making contact with a prescribed lead 202a, and a terminal 205a for contacting all of the leads 202a of the IC 202 to completely eliminate electric charges left behind slightly in a circuit of the IC 202 after the electrical discharge.

The metal plate 203 is connected to a DC high voltage power source 206, which can preferably generate a voltage arbitrarily from about 0 V to about 3 kV.

The metal bar 204 has a sliding mechanism, etc., driven by a motor, whereby it is made movable onto an arbitrary lead 202a by allowing the sliding mechanism to be operated in the X—Y directions while it is brought into contact with and separated from a prescribed lead 202a by allowing the sliding mechanism to be operated in the z direction (vertically). Moreover, the bar 204 is connected to an equivalent impedance means 207, whereby it can adjust the discharge from the IC 202. The bar 204 is shown in the figure so as to be movable in the X—Y—Z directions, but it may be adapted to have a function of moving only vertically, and adapted to be movable in the X—Y directions with the aid of the motion of a table including the metal plate 203. Furthermore, for the driving source described above, not only a motor but also pneumatic pressure or hydraulic pressure means may be applicable.

The metal bar 204 has its cross section rounded and a tapered end part thereof in contact with the lead. The length of a cylindrical part of the metal bar 204 is more than 10 mm with a diameter thereof being more than 5 mm. The length of the tapered part is less than 10 mm with the diameter of the tip end surface thereof being more than 0.5 mm.

The terminal 205a is fixedly mounted on a terminal base 205b, and movable therewith. In addition, these terminals 205a are connected to the ground potential, the number of which terminals is at least the same as that of the leads 202a of the IC 202, and these terminals 205a are made free to make contact with all the leads 202a by their movements toward the IC 202. When the IC 202 has its leads arranged bidirectionally as in a dual inline package IC, it has a set of right and left terminals 205a, while when it has its leads 202a arranged in four directions as in a chip carrier, etc., it has a set of terminals 205a in four directions. It is apparent that in the case of the set of the leads 202a arranged in four directions, the number of the terminals 205a should be the same as that of the leads 202a; otherwise it would be difficult to make contact with the leads 202a.

The terminal 205a may preferably be arranged so as to be switchable also to a tester 209 in addition to the ground potential by means of a switch 208 such as a relay, etc. If so, it can be immediately determined if an electrostatic breakdown is produced in the IC 202 in addition to a function of the terminal 205a for eliminating the stored electric charges, and furthermore, the space needed to provide separate terminals for the tester 209 can be saved. However, it is also possible to provide separate terminals for the tester independently of the terminal 205a to judge whether or not an electrostatic breakdown has been produced.

Figure 2:
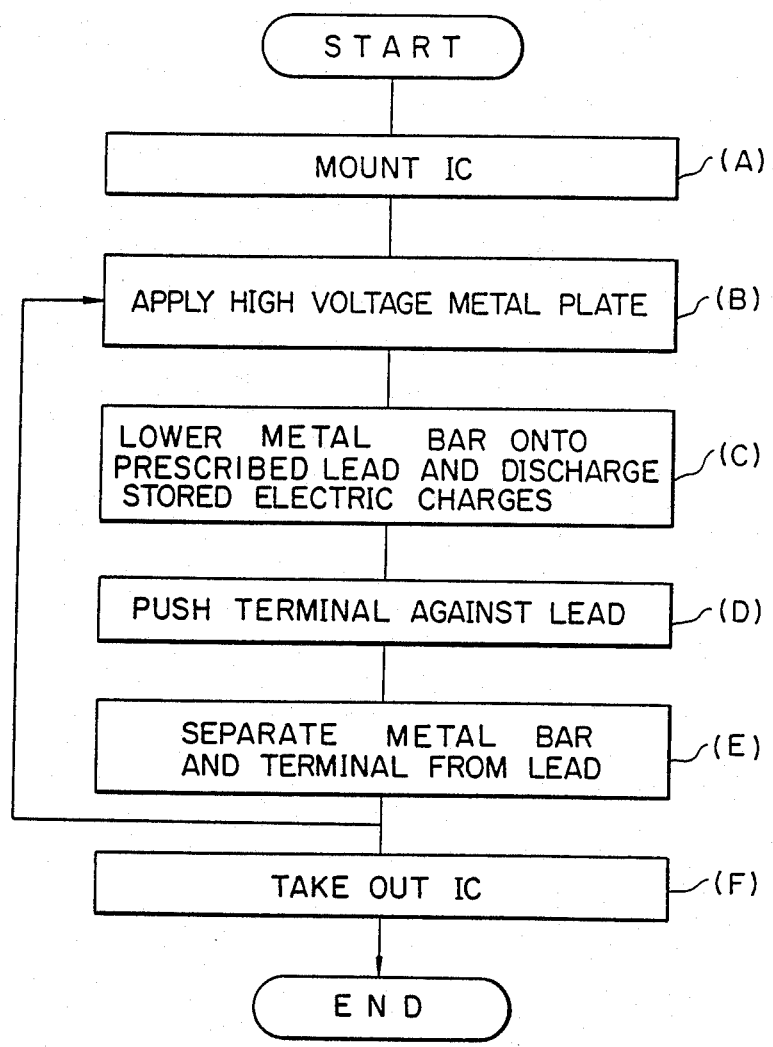
FIG. 2 is a flowchart illustrating the test steps of FIG. 1.

The test steps of the apparatus 201 are described below with reference to FIG. 2.

(A) The IC 202 is mounted on the metal plate 203. The metal plate 203 preferably has a frame into which the IC 202 is securely fitted for facilitating positioning thereof.

The following steps are of those of the electrostatic withstand voltage testing for each lead 202a.

(B) A high voltage is applied to the metal plate 203 for charging a package of the IC 202 with electricity.

(C) The metal bar 204 is then lowered to a prescribed lead 202a for producing an electrical discharge, and thereafter the high voltage is cut off.

(D) The electric charges left behind in the IC 202 are discharged by pushing the terminal 205a against the lead 202a while keeping the lead 202a and the metal bar 204 in contact. The contact between the lead 202a and the metal bar 204 kept as such is to prevent electrostatic breakdown from being produced at portions other than the discharged lead 202a due to inverse voltage induced as electric charges are discharged from the terminal 205a since electric charges are stored in the circuit of the IC 202 owing to penetration of the electric charges through the package due to the high voltage.

After discharging the electric charges in the circuit, the switch 208 is switched for connection to the tester 209, which then checks to see if an electrostatic breakdown has been produced. This is done after discharging the electric charges remaining in the circuit. Otherwise, the tester is erroneously operated, or in the worst case may be destroyed.

(E) The metal bar 204 and the terminal 205a are separated away from the lead 202a.

The steps of the electrostatic breakdown voltage testing at the first time for a prescribed lead 202a is finished. Steps (B) to (E) are then repeated for each lead 202a. In addition, the voltage to be applied to the metal plate 203 is changed and these steps are repeated.

(F) When the electrostatic breakdown voltage testing for each lead 202a is finished, the IC 202 is disconnected from the metal plate 203.

Figure 3:
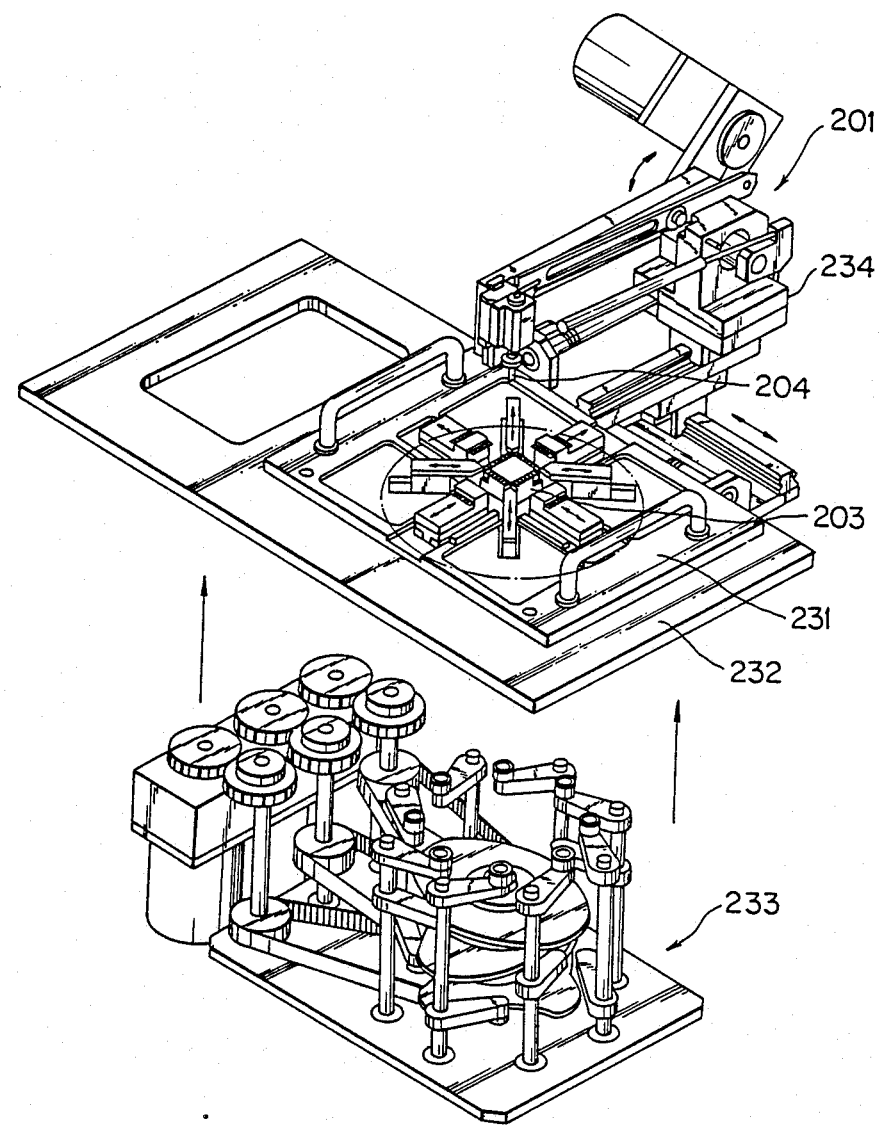
FIG. 3 is a perspective view illustrating the whole electrostatic breakdown voltage test apparatus.

In succession, the whole of the embodiment of the electrostatic withstand voltage testing apparatus will be described with reference to FIG. 3. As shown in the figure, the apparatus 201 has a test table unit 231 including the metal plate 203 and the terminal base 205b illustrated in FIG. 1, a test table base 232, a drive unit 233 for transmitting power to the test table unit 231, and a bar drive base 234 for moving the metal bar 204 onto the arbitrary lead 202a of the IC 202.

Figure 4C:
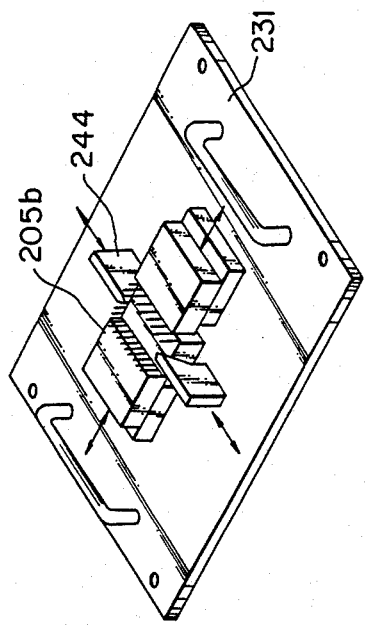
FIGS. 4(a)-4(c) are perspective views illustrating a combination of a test table unit and a test table base.
Figure 4B:
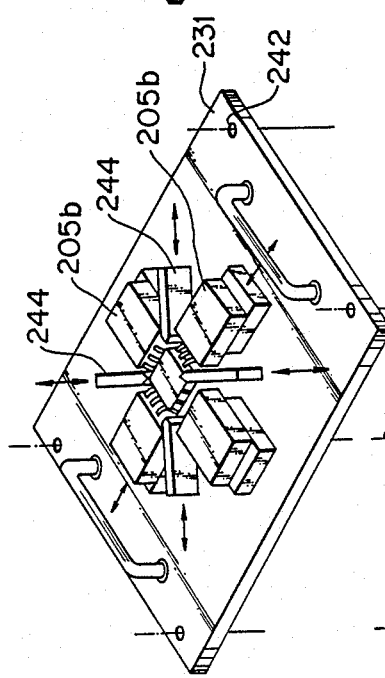
Figure 4A:
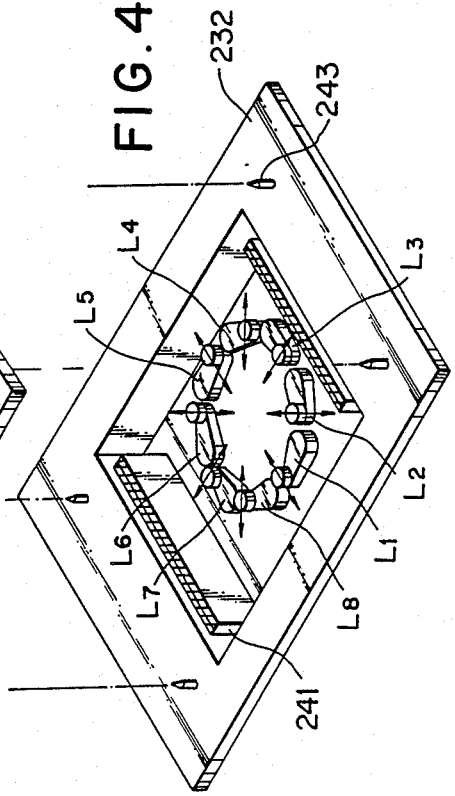

The test table unit 231 and the test table base 232 are arranged as shown in FIGS. 4(a)-4(c).

FIG. 4(a) shows the test table base 232, whereon levers L1 through L8 being part of the drive unit 233 are exposed. In addition, a connector 241 is provided on the side of the test table 232 for electrically connecting the test table 232 to the table unit 231.

FIGS. 4(b) and 4(c) show the test table units 231 respectively for a PLCC and a DIP. The test table unit 231 having four holes 242 is guided for mounting by corresponding projections 243 provided on the test table base 232. Moreover, another connector fitting to the connector 241 is provided downwardly of the test table unit 231, and connection between these connectors is simultaneously effected by fitting of the hole 242 to the projection 243. Furthermore, cams are projected at positions corresponding to the levers L1 through L8 downwardly of the terminal base 205 provided on the test table unit and the chuck 244 for pressing the IC, and pushed and driven by movements of the levers L1 through L8 in a direction of the center of the test table unit.

The test table unit 231 (FIG. 4(b)) for a PLCC has eight, in total, of slide parts for the four terminal bases 205b so as to make contact with leads of the PLCC derived in four directions, and for four chucks 244 so as to push four corners of the package. These slide parts are resiliently supported in the opposite direction to the outer, and adapted to slide in this opposite direction owing to the movement of the levers toward the outer.

The test table unit 231 (FIG. 4(c)) for a DIP has four, in total, slide parts for a set of the terminal bases 205b in contact with the leads disposed along a long side of the IC, and for a set of chucks 244 each serving to push a short side of the IC. These slide parts are also adapted to slide toward the center, but upon operation thereof any lever among the levers L1 through L8 has not a corresponding slide, which lever may not be driven.

Figure 5:
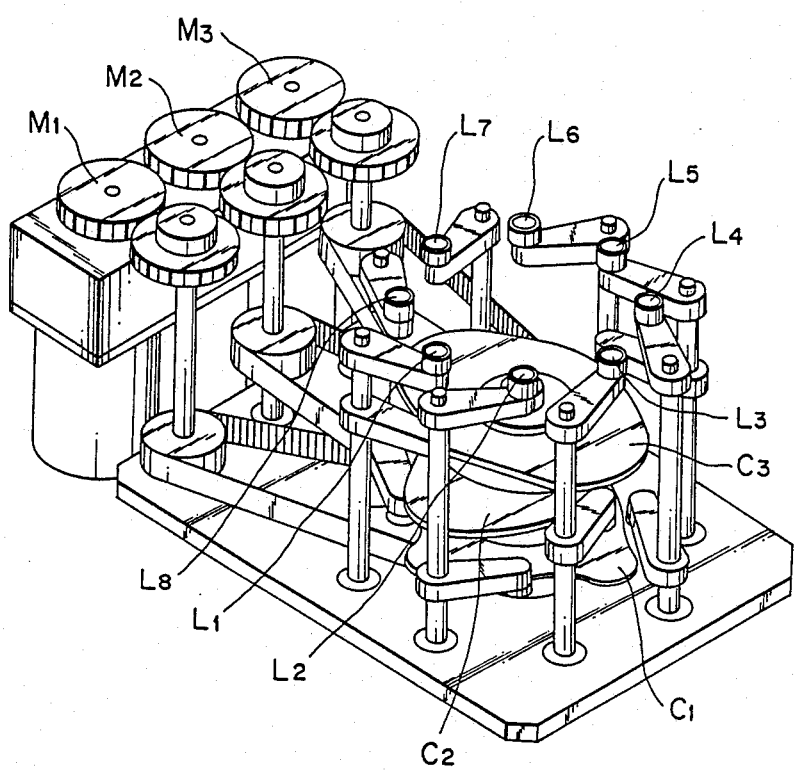
FIG. 5 is a perspective view illustrating a drive part.

The drive unit 233 has three sheets of plate cams C1 through C3 as shown in FIG. 5, which are arranged so as to be rotatable respectively independently around the same shaft, and driven respectively by motors M1 through M3 via respective timing belts. Eight shafts are arranged in the neighborhood of the cams C in an equal interval around a concentric circuit taking the shaft described previously as a center, each of which is supported to be rotatable with the aid of bearings. The levers L1 through L8 are provided on the upper end of each of the respective shafts and the cams L1 and L5 thereamong are arranged so as to follow the cam C3 while the levers L2, L4, L6, and L8 are arranged to follow the cam C1 and the levers L3 and L7 are arranged to follow the cam C2.

Driven levers following the cam C are provided downwardly of the levers L1 through L8. These levers, since each fixedly mounted on the shaft, can transmit the motion of the motor M transmitted via the cam C to the levers L1 through L8.

The present embodiment of the electrostatic breakdown voltage testing apparatus can exchange the test table unit 231 with ease depending on the type and shape of an IC to be tested, so that it can easily inspect a plurality of ICs having different shaped packages.

A modification of this embodiment is described below.

In the above embodiment, an IC was fixed on the metal plate 203 using a chuck means. Instead of this, a vacuum chuck may be employed by making a small hole in the metal plate 203 and then forming a vacuum through the hole. Moreover, the terminal 205a was divided for each lead to serve also as a terminal of the tester, but it may be plate-shaped over all leads provided a tester terminal is provided independently. Thus, electric charges existent in the IC can be removed.

Another embodiment of the electrostatic breakdown voltage testing apparatus of the present invention is described below.

The apparatus in the present embodiment has a circuit for lowering the voltage of a power source.

Figure 6:
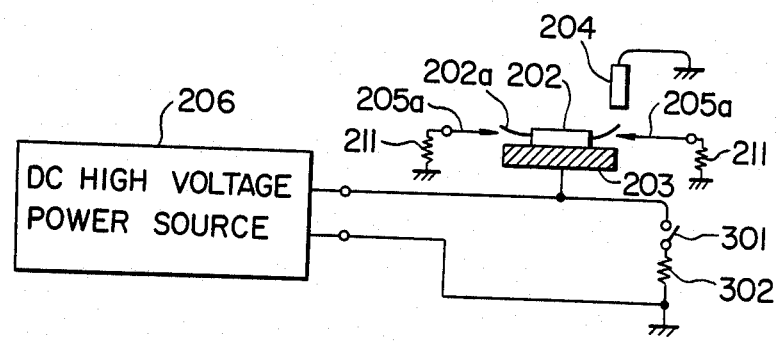
FIG. 6 is a block diagram illustrating an electrostatic breakdown voltage testing apparatus having a circuit for the lowering voltage of a power source according to the present invention.

As shown in FIG. 6 illustrating an electrostatic breakdown voltage testing apparatus for the IC 202 of the present invention, the metal plate 203 is connected to the DC high voltage power source 206, on which the IC 202 to be tested is mounted. The metal plate 203 is further connected to one end of a switch means such as a relay 301; the other end of the relay 301 is grounded via a resistor 302. The terminal 205a is grounded via a resistor 211. The metal bar 204 and the terminal 205a are brought into contact with the lead 202a of the IC 202 upon testing.

First, in a state of the apparatus where the relay 301 is opened, the metal bar 204 off, and the terminal 205a off, voltage is applied from the power source 206 to the IC 202 mounted on the metal plate 203. When the voltage of the IC 202 reaches a prescribed value, the metal bar 204 is brought into contact with the lead 202a of the IC 202 for producing discharge. Thereafter, the terminal 205a is brought into contact with the lead 202a for removing electric charges left behind in the IC 202. The testing so effected for the lead 202a is finished with a series of the operations described above, and to be ready for the next lead 202a, the power source 206 is dropped with the relay 301 being closed, and thereafter the metal bar 204 and the terminal 205a are separated from the lead 202a.

According to the present invention, as described in detail in the first embodiment, the electrostatic breakdown voltage testing apparatus has the metal plate capable of charging an IC to be tested with electric charges, and the metal bar and the terminal capable of making contact with and separating from the lead of the IC. Accordingly, the charged package breakdown testing method can be executed with ease. In particular, it is effective in shipping and acceptance inspections.

Furthermore, according to the present invention, as described in detail in the second embodiment, the electrostatic breakdown voltage testing apparatus is adapted to have the relay and the resistor provided in the output of the power source, whereby a potential of the metal plate can rapidly be lowered by closing the relay. Accordingly, it can be anticipated to shorten the cycle time from the finish of a test at a certain lead to the start thereof at the next lead. Furthermore, the present apparatus can also be employed as a safety device in case where an IC to be tested is mounted on the metal plate, by keeping the relay closed.

Although certain preferred embodiments have been shown and described, it should be understood that many changes and modifications may be made therein without departing from the scope of the appended claims.

What is claimed is:

1. An apparatus for testing a semiconductor device including a dielectric package and a lead with respect to a discharge voltage thereof against electrostatic charges stored on said dielectric package, comprising:
   (a) a charging means having a metal plate connected to an output terminal of a DC power source for charging said dielectric package by bringing said metal plate into contact with the surface of said package when a voltage is supplied from said DC power source thereto;
   (b) a first discharge means having a metal bar connected to a ground potential for discharging charges stored on said package by selectively bringing said metal bar into contact with said lead subsequent to the charging of said package; and
   (c) a second discharge means having a terminal connected to the ground potential for discharging charges remaining within a circuit of said semiconductor device by bringing said terminal into contact with said lead after stopping the supplying of the voltage from said DC power source subsequent to said discharging of said charges by said first discharge means.

2. An apparatus for testing a semiconductor device according to claim 1, further comprising means to connect said output terminal of said DC power source to the ground potential after said discharging by said second discharge means.

* * * * *